(12) United States Patent
Hardy et al.

(10) Patent No.: US 7,994,788 B2
(45) Date of Patent: Aug. 9, 2011

(54) SHORT HYBRID MICROSTRIP MAGNETIC RESONANCE COILS

(75) Inventors: Christopher Judson Hardy, Schenectady, NY (US); Kenneth William Rohling, Porter Corners, NY (US); Selaka Bandara Bulumulla, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 109 days.

(21) Appl. No.: 12/609,303

(22) Filed: Oct. 30, 2009

(65) Prior Publication Data
US 2010/0253462 A1    Oct. 7, 2010

Related U.S. Application Data

(60) Provisional application No. 61/166,454, filed on Apr. 3, 2009.

(51) Int. Cl.
G01V 3/00 (2006.01)
(52) U.S. Cl. .......................................... 324/318; 324/322
(58) Field of Classification Search .......... 324/300–322; 600/407–422
See application file for complete search history.

(56) References Cited

U.S. PATENT DOCUMENTS

| | | | |
|---|---|---|---|
| 5,596,804 A * | 1/1997 | Hogge et al. ................... | 29/840 |
| 5,886,596 A | 3/1999 | Vaughan | |
| 6,633,161 B1 | 10/2003 | Vaughan | |
| 6,771,070 B2 | 8/2004 | Lee | |
| 6,958,607 B2 | 10/2005 | Vaughan | |
| 6,969,992 B2 | 11/2005 | Vaughan | |
| 7,088,104 B2 | 8/2006 | Bottomley | |
| 7,202,668 B2 | 4/2007 | Ludwig et al. | |
| 7,375,527 B2 | 5/2008 | Vaughan | |
| 7,427,861 B2 | 9/2008 | Bogdanov et al. | |
| 7,471,173 B2 * | 12/2008 | Hidaka et al. .................. | 333/204 |
| 7,501,825 B2 * | 3/2009 | Lee ................................. | 324/322 |
| 7,755,357 B2 * | 7/2010 | Holle et al. .................... | 324/318 |
| 2006/0197633 A1 | 9/2006 | Lee | |
| 2009/0099444 A1 | 4/2009 | Bogdanov | |

OTHER PUBLICATIONS

C. J. Snyder et al; High-Field Transmission Line Arrays for Transmit and Receive; Proc. Intl. Soc. Mag. Reson. Med. 14 (2006); p. 421.

Ananda Kumar and Paul A. Bottomley; Optimizing the Intrinsic Signal-to-Noise Ratio of MRI Strip Detectors; Magnetic Resonance in Medicine 56:157-166 (2006), pp. 157-166.

Bulumulla SB, Rohling KW, Fiveland E, Park KJ, Gibeau MM, Marinelli L, Hardy CJ. "Short hybrid micro-strip coils" International Society for Magnetic Resonance in Medicine 17th Meeting, Apr. 18-24, 2009, Honolulu, p. 2984.

* cited by examiner

*Primary Examiner* — Brij B Shrivastav
(74) *Attorney, Agent, or Firm* — Scott J. Asmus

(57) ABSTRACT

A hybrid microstrip coil for magnetic resonance imaging including a microstrip assembly aligned in the superior/inferior (S/I) direction. In one example, the microstrip assembly has conductive strips disposed on one side of a substrate corresponding shield planes disposed on the other side of the substrate. The microstrip assemblies are coupled together by coaxial sections forming a continuous transmission line and having a specific overall electrical length.

19 Claims, 3 Drawing Sheets

SHORT HYBRID MICROSTRIP MAGNETIC RESONANCE COILS

CROSS REFERENCE TO RELATED APPLICATIONS

This application claims the benefit of U.S. Provisional Application No. 61/166,454, filed Apr. 3, 2009, which is herein incorporated in its entirety by reference.

BACKGROUND DESCRIPTION

Microstrip magnetic resonance (MR) coils are useful for magnetic resonance imaging (MRI) especially at high fields, because of their relative immunity to wavelength effects. These coils typically consist of a linear conducting strip backed by a dielectric layer and then a wider conducting shield layer. Microstrips are typically used for receiver coils and tuned to an integer multiple of half the wavelength ($\lambda/2$) at the Larmor frequency, and are oriented along the direction of the static magnetic field B0. Because of these length constraints, and given practical values for the dielectric layer, microstrips tend to stretch over fairly long distances (typically 30-50 cm). For this reason, groups of multiple microstrips are arrayed in the anterior/posterior (A/P) and/or right/left (R/L) directions. If parallel imaging is performed, then it is not possible to have significant accelerations in the superior/inferior (S/I) direction with these arrays.

In more particular details, microstrip receiver coils are typically designed as half-wave or quarter-wave resonators, which are aligned along the axis of the static magnetic field B0. In cylindrical-bore systems, this axis corresponds to the patient superior/inferior (S/I) direction. The relatively long wavelengths at imaging frequencies such as 63.8 MHz (1.5 T) or 127.7 MHz (3.0 T) therefore result in coils that are too long (e.g. 46 cm and 92 cm for quarter wave and half wave resonators) to be arrayed in the superior/inferior (S/I) direction, and so these receiver coils are typically only arrayed in the left-right and/or anterior/posterior directions. Although tuning with lumped elements has been considered for microstrips, the demonstrated designs are 30 cm or greater in length, which is too long for arraying in the S/I direction. This decreases their utility, because parallel imaging with accelerations in the S/I direction is precluded.

BRIEF DESCRIPTION

The systems and methods relate to microstrip coils, and one embodiment employs microstrip coils arrayed in the S/I direction and aligned along the axis of the static magnetic field B0.

One embodiment is a hybrid microstrip coil for magnetic resonance imaging, having at least one microstrip assembly. Each microstrip assembly has one or more conductive strips disposed upon a first side of a substrate and corresponding shield planes disposed on a second side of the substrate, wherein the shield planes are aligned opposing the conductive strips. There are one or more coaxial sections disposed on the first or second side of the substrate, wherein the coaxial sections form a continuous transmission line with the microstrip assembly and having a specific overall electrical length wherein the microstrip assembly is aligned in the superior/inferior (S/I) direction, and the hybrid microstrip coil is oriented along a static magnetic field B0. The hybrid microstrip coil in one example is a microstrip receiver coil and comprises at least one additional microstrip assembly interleaved with the hybrid microstrip coil.

In one aspect the microstrip assembly is comprised of linear segments and has a length of less than 30 cm. Other aspects have a length of less than 20 cm.

Another embodiment is an array structure for magnetic resonance imaging, including two or more hybrid microstrip receiver coils forming the array, each of the receiver coils having microstrip assemblies with a plurality of conductive strips on a first side of a substrate and corresponding shield sections opposing the conductive strips on an opposite side of the substrate. There are coaxial cables on at least one side of the substrate electrically coupling the microstrip assemblies forming a continuous transmission line with a specified overall electrical length, wherein center conductors of the coaxial cables electrically couple adjacent conductive strips and corresponding outer conductors of the coaxial cables are electrically coupled to adjacent shield sections.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
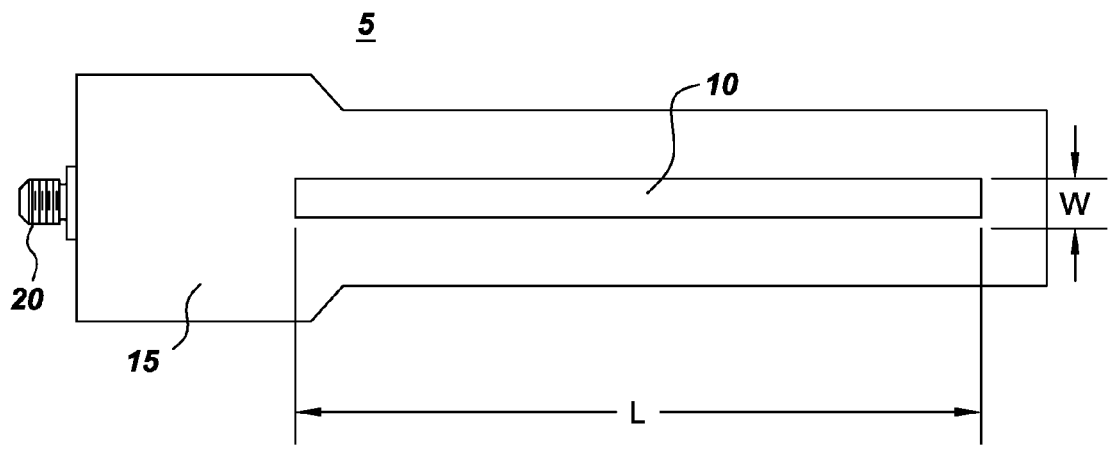
FIG. 1 illustrates an isolated microstrip coil section.

The hybrid microstrip coil detailed herein provides for a smaller form factors. While described primarily for receiver applications as illustrative embodiment, it is noted that the hybrid microstrip coil operates for both transmit and receive applications.

One embodiment comprises multiple short sections of microstrip each aligned in the superior/inferior (S/I) direction, and arrayed, such as in the R/L direction. In one example, neighboring sections of microstrip are connected on the ends with short sections of coaxial cable having the same characteristic impedance as the microstrip. Such a design relates to building coils that have desired wavelength characteristics along the length of the transmission line but are much shorter in the S/I direction using coax/microstrip hybrids. According to one example application, the system provides for parallel transmit.

Referring to FIGS. 1, 2a, 2b, and 3, according to one embodiment microstrip coils 5 are described having at least one microstrip assembly 30 comprising a conductive strip 10 deployed on a substrate material 15 and backed by shield plane 50. There is a connector 20 coupled on one end that is, for example, a coaxial connector, and in this example the center conductor of connector 20 is electrically coupled from the opposing side of the substrate to the conductive strip 10 by a via, trace or conductive mechanism 60. This opposing side of the substrate 15 typically has a wide conducting plane 50 that acts as the shield. The outer conductor of connector 20 is electrically connected to the shield 50.

Figure 2A:
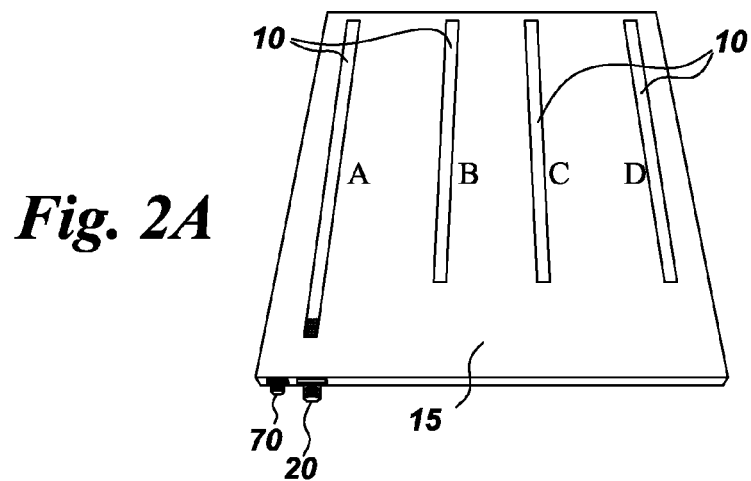
FIG. 2a illustrates the imaging side of the microstrip-coaxial design according to one embodiment.
Figure 2B:
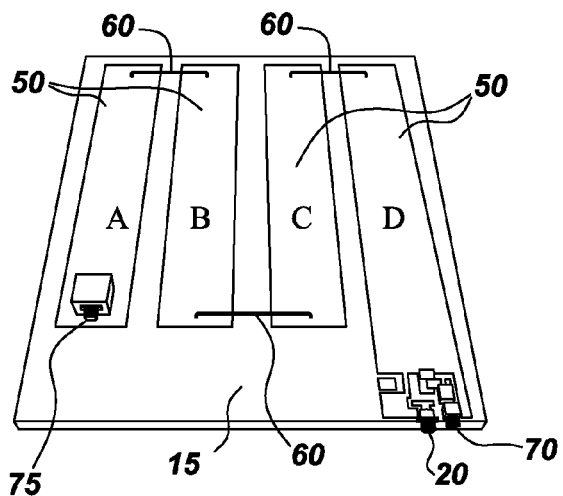
FIG. 2b illustrates the ground plane and coaxial connections of the microstrip-coaxial design from FIG. 2a in accordance with one embodiment.
Figure 3:
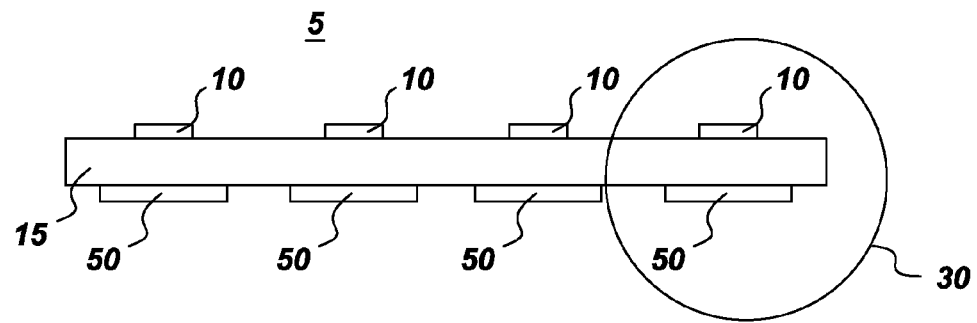
FIG. 3 is a cross sectional view of the hybrid microstrip coil configured in accordance with one embodiment.

As shown in FIGS. 2a and 2b, multiple microstrip assembly 30 can be electrically connected together using coaxial sections 60 of the same characteristic impedance such that the microstrip assembly 30 and coaxial sections 60 form a continuous transmission line structure that overall has an electrical length such as $\lambda/2$ or some multiple thereof.

In this example, at each end of a coaxial section 60, the outer conductor is electrically connected to the shield 50 and the center conductor is electrically connected through a via, trace, or conductive mechanism (e.g. wire through a drilled hole in the substrate) (not shown) to the conductive strip 10. A receiver coil or resonator 5 can be formed from an individual microstrip assembly 30 or can comprise multiple connected microstrip assemblies 30 and coaxial sections 60. In one example the coaxial sections 60 is placed on the side with the conductive strip 10 and in another example the coaxial section 60 is placed on the side with the shield 50.

For example, referring again to FIGS. 2a and 2b, a microstrip coil is depicted having four microstrip assemblies coupled as a continuous transmission line or coil. There are four parallel microstrip assemblies 30, and microstrips A and B are connected by a coaxial section, for example, at the superior end, microstrips B and C are connected by a coaxial section 60 at the inferior end, and microstrips C and D at the superior end, to form a continuous transmission line that snakes back and forth. These adjacent microstrip assemblies 30 are connected to corresponding coaxial sections 60 at the alternating ends to form the continuous transmission line. The use of multiple layer boards and various coatings disposed upon one or more of the surfaces of the substrate is also within the scope of this system. Furthermore, while the conductive strips 10 and corresponding shields 50 are depicted as linear segments that form the microstrips 30, the conductive strips 10 and shields 50 can be other shapes such as curved segments.

According to one embodiment, the overall electrical length of the transmission line is arranged to be an integer multiple of $\lambda/2$, but the physical length of the coil in the S/I direction is much shorter, because the coil snakes back and forth from the conductive strips and along the coaxial sections. Because the coaxial cable is completely shielded, it does not pick up signal or noise from the imaging subject, and only the microstrip sections contribute to the image.

In one exemplary embodiment, interleaved coaxial sections are used to produce coils that have desired wavelength characteristics but are much shorter in the z direction (S/I directions), and lumped-elements can also be used to fine-tune the overall electrical length of the coil.

One example for illustrative purposes of the dielectric substrate is a low cost substrate material, such as FR4 or lower loss substrate material such as the high frequency circuit materials (e.g.: RO3210) from Rogers Corporation, Chandler, Ariz., USA, which has a dielectric constant of 10.2 and dissipation factor of 0.0027, suitable for higher frequency, but substantially more expensive than FR4, that has a substrate thickness of about 5 mm. The width W of the microstrip is about 5 mm and the width of the ground plane is about 3 cm. The resonator 5 is tuned to a half-wavelength and matched to 50 ohms using a lumped element circuit such as by using variable capacitors. In the illustrated embodiment, the overall length of the resonator is about 10 cm.

While there are existing systems using one or more microstrips, the present design is distinguishable in several respects. For example, one of the features alternates (in a single transmission line) microstrip segments with coaxial cable of the same characteristic impedance, forming a sinuous pattern, to create a transmission line structure whose electrical length is an integer multiple of a half wavelength, but whose physical length can be much shorter than is otherwise possible. One embodiment involves tuning the coil by adding bulk capacitors to the microstrips.

A further embodiment tunes the coil by adjusting the length of the coaxial sections of the transmission line such that the overall electrical length of the coil is, for example, an integer multiple of $\lambda/2$, for example $\lambda$. The coaxial lines contain the electromagnetic (EM) field, and so these portions of the structure do not contribute to the NMR signal (or noise).

Furthermore, conventional microstrip designs have been used primarily for volume head coils that comprise strips running longitudinally and arrayed around the circumference of a cylinder that goes around the head. The microstrips in such a conventional design are so long that they cannot be arrayed in the longitudinal direction. One embodiment refers to coils used as a multi-channel array (instead of a single coil), and arrayed on a surface, in two or more directions.

While the examples are directed primarily to parallel imaging (using multiple receive coils), the system also has applications in parallel transmit. The construction of coils involves more than simply using lumped elements, but rather is a specific design that maintains an electric length of a specific value. This type of coil has benefits in parallel imaging and parallel transmit.

One design, for illustrative purposes, refers to a microstrip receiver coil of a shorter and more practical length than conventional designs. In one example the microstrip receiver coil has a length of less than 30 cm. A further example is for a microstrip receiver coil having a length of less than 20 cm. Still another example the microstrip receiver coil is about 10 cm. This is accomplished by combining microstrip sections with coaxial lines into a single transmission line structure that overall has an electrical length, such as $\lambda/2$, but that is much shorter physically. This then allows one to array the coils in the S/I direction and perform parallel imaging with acceleration in that direction.

Referring again to FIG. 2a and FIG. 2b, the microstrip receiver coil 5 consists of four parallel microstrip sections 30, with the microstrip assemblies electrically connected using coaxial sections 60. The electrical connections between the microstrip sections 30 and the coaxial sections 60 can be implemented using vias, traces or other conductive mechanisms to the center conductor of the coaxial section 60. The shield plane 50 connects to the outer coaxial shield.

Referring again to FIG. 3, a cross sectional perspective of the hybrid receiver coil 5 is depicted wherein the imaging object resides on the side facing the conductors 10. The coaxial sections are not depicted in this view for ease of illustration and are depicted in the bottom view of FIG. 5.

As illustrated, the conductive strips 10 are disposed on or into the substrate 15 on a first side. There are various manufacturing methods for disposing the conductive strips on the substrate. There are shield planes 50 disposed on a second side of the substrate 15 approximately along the same path as the conductive strips 10. The imaging of the object takes place in proximity to the first side and the conductive strip 10.

The placement and length of the microstrip sections 30 along with the coaxial sections are designed to establish the desired performance characteristics. The approximate dimensions are typically calculated and can be adjusted by tuning such as by using capacitors or by adjusting the length of the transmission line. The length of the transmission line can be adjusted by adjusting the length of the coaxial sections. The lengths of the microstrip assemblies 30 and the coaxial sections 60 are typically selected so that overall electrical length of the transmission line is a multiple of a half wavelength. At one end of the microstrip assemblies, a tuning capacitor 75 to ground can be used for minor adjustment of electrical length. At the other end of the microwave assembly by the connector 20, an impedance matching circuit 70 can be utilized. The coaxial section 60 is selected to have essentially the same characteristic impedance as the microstrip characteristic impedance when loaded, such as when next to the imaging object, and has a smaller diameter to facilitate a compact design. The coaxial sections 60 run orthogonal to the direction of the main magnetic field and do not acquire the free induction decay signal or thermal noise from the imaging object due to the outer shield of the cable. While the coaxial section 60 is shown as a straight section, the coaxial sections can also be flexible cables that are more easily adjusted or sized for the proper performance characteristics.

In the illustrated embodiment the microstrip/coaxial receiver coils are manufactured using a substrate material having a substrate thickness of about 5 mm and conductive strip 10 width of about 5 mm. The outer diameter of the coaxial cable is about 1.8 mm and the characteristic impedance is 25 ohms, which matches the characteristic impedance of microstrip assemblies when loaded.

Figure 4:
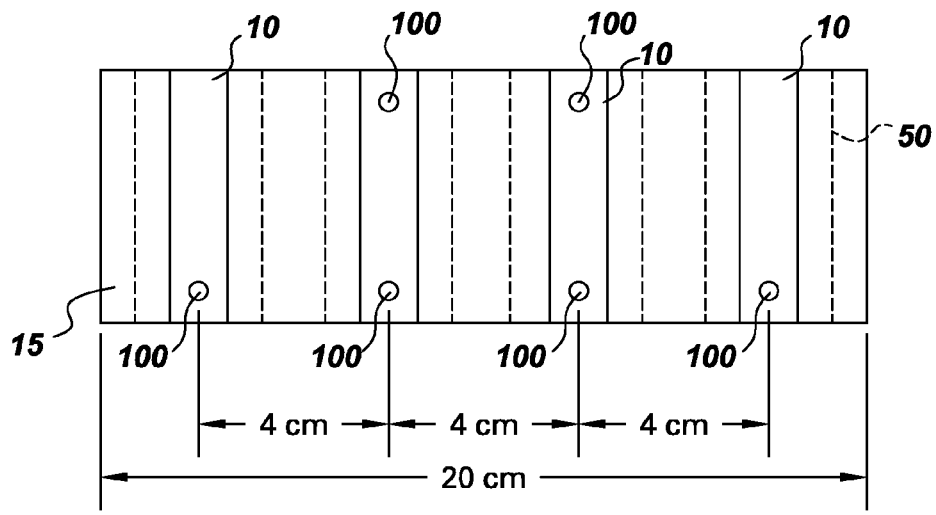
FIG. 4 is a top view of the hybrid microstrip coil showing the electrical connections between the microstrips and the ground plane configured in accordance with one embodiment.

Referring to FIG. 4, a cross sectional bottom view of the substrate illustrates the vias 100 used to electrically couple from the center conductor of the coaxial sections to the end of the conductive strip 10. The vias 100 are positioned to accommodate the conductive strip coupling on the first side to the coaxial sections located on the second side. The center conductor of the coaxial section is electrically coupled to the conductive strip 10.

The vias 100 are typically holes in the substrate 15 and in one example the vias can have conductive material that provides for a coupling from the conductive strip to the center conductor of the coaxial section.

Figure 5:
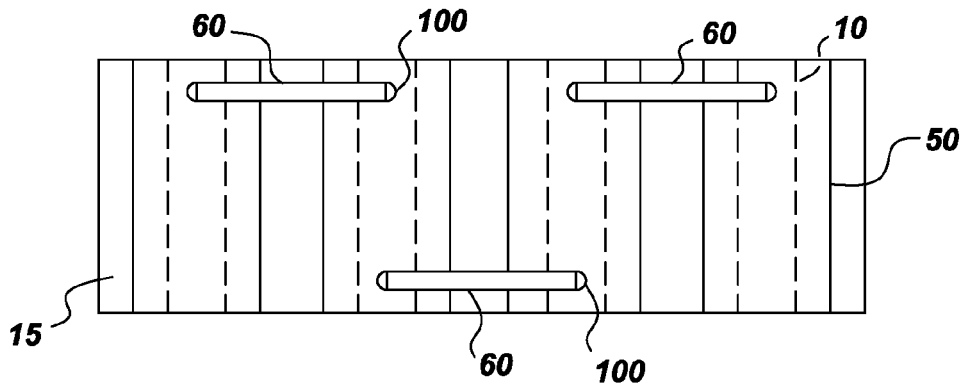
FIG. 5 is a bottom view of the hybrid microstrip coil showing the coaxial connections between the microstrips configured in accordance with one embodiment.

For illustrative purposes some dimensions are illustrated to show one example of operation. The conductive strips are about 5 mm wide and separated by about 4 cm with a length of about 12.28 cm. The substrate is about 12.28 cm long and has a width of about 20 cm. The conducting cables 60 on the bottom side are illustrated in FIG. 5 and in this example would be about 4 cm long or more to couple between the vias 100. The shield planes 50 are about 25 mm wide.

Referring to FIG. 5, the bottom side view illustrates the shield planes 50 and the coaxial sections 60 that have the center conductor electrically coupled to the vias 100 so that they are coupled to the conductive strips 10 on the top side. The coaxial sections in one example are 25 ohm coaxial cables, part number HC 5000D-1 from Haverhill Cable and Manufacturing Company, Haverhill, Mass., USA.

Figure 6:
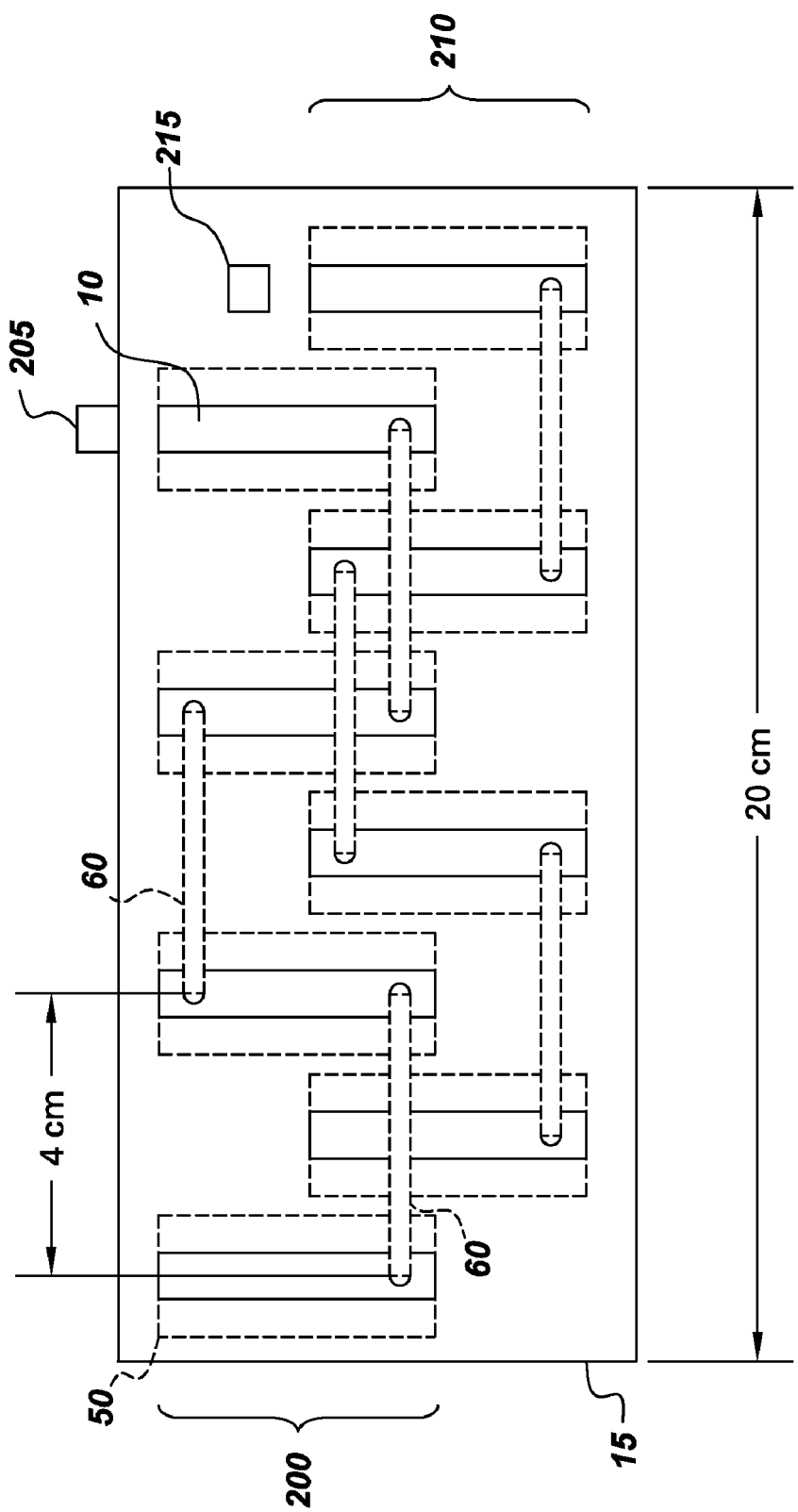
FIG. 6 illustrates an array design with two interleaved microstrip coils configured in accordance with one embodiment.

FIG. 6 shows one embodiment for an array design with two interleaved receiver coils. Coil 200 has four microstrip sections A-D with corresponding vias 100 that couple from the conductive strips 10 on a first side to the opposing side (shown in phantom) wherein the center conductors of the coaxial segments 60 (shown in phantom) make the electrical connections for the coil 200 allowing it to operate as a first continuous transmission line. The shielding for the coaxial sections 60 are coupled to the shield planes 50 also shown in phantom. Coil 210 has four microstrip sections E-H with corresponding vias 100 that couple from the conductive strips 10 on a first side to the opposing side (shown in phantom) wherein the center conductors of the coaxial segments 60 (shown in phantom) make the electrical connections for the coil 200 allowing it to operate as a second continuous transmission line. There are two coil connectors 205, 215 that provide the external connector for each coil wherein the conducting strip is electrically coupled to the coil connectors 205, 215. Additional matching components may be used for tuning.

The microstrips A-D of the first coil 200 in this example are disposed approximately 4 cm apart with the second coil 210 having microstrips also placed approximately 4 cm apart. In this example the two coils 200, 210 are interleaved such that there is an overlap of the microstrips E-H in-between the spacing of the first set of microstrips A-D such that the entire length is about 20 cm or less. The coaxial segments 60 on the opposing side allow the signals from the first coil 200 to cross over the interleaved second coil 210. In one example the coaxial segment 60 has an outer dielectric covering such that it can contact the interleaved conductive strips 10 or shield planes 50 without affecting performance. In other embodiments the conductive strips 10 and/or shield planes 50 can include dielectric coatings. The coaxial segment 60 can cross over any interleaved conducting strips or shield planes without making any physical contact.

In one exemplary application, four resonators were placed on a standard head phantom for imaging. The resonators were arrayed in both left-right and superior-inferior directions in a 2×2 array. The phantom and the 2×2 array were placed in 3.0 T scanner (Signa, GE Healthcare, WI, USA) and images from each coil were acquired demonstrating operability.

One of the innovative features of the present device is the interleaving of microstrips with coaxial cables of the same characteristic impedance. Such a design is especially useful for imaging at 3 T or 7 T. One of the benefits is that this system allows faster imaging at high field strengths.

One embodiment comprises RF receiver coil arrays for use in an MRI scanner. Parallel imaging using microstrip arrays and acceleration in the S/I direction is not currently possible, because the coils are too long to be arrayed in the S/I direction. In one example of the present system, parallel imaging with accelerations in the S/I direction are accomplished using short microstrip receiver coils. The length of microstrip resonators is reduced and the hybrid design incorporates lumped elements. In a second example, the design alternates between microstrips and coaxial lines of the same characteristic impedance.

In some examples the dielectric constant of the substrate, thickness of substrate, trace width, shield width and coupling of the coaxial cables affect the characteristic impedance and electrical length. The electrical length due to cable sections can be obtained from certain simulation programs that simulate electromagnetic fields or derived empirically. The microstrip and cable lengths in on example are selected to add up to a multiple of half wavelengths for resonance. In the spacing of the conducting strips, there is a trade-off between coverage and cross talk. The microstrip assemblies comprising the conducting strips and corresponding shields have certain coverage, and if the microstrip assemblies are placed far apart, there are gaps in the image and if the microstrip assemblies are placed too close to each other, there is potential of coupling between the strips.

Although the descriptions are illustrated by resonators designed to have electrical lengths that are integer multiples of $\lambda/2$, the electrical lengths can be selected as odd integer multiples of λ/4 as well. Resonators with an electrical length of λ/4 have different sensitivity profiles from resonators with electrical length λ/2 and may be preferred under certain circumstances.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

The invention claimed is:

1. A hybrid microstrip coil for magnetic resonance imaging, comprising:
   at least one microstrip assembly, each microstrip assembly comprising two or more conductive strips disposed upon a first side of a substrate and corresponding shield planes disposed on a second side of the substrate, wherein said shield planes are aligned opposing said conductive strips; and
   one or more coaxial sections disposed on the first or second side of said substrate, said coaxial sections forming a continuous transmission line with the microstrip assembly and wherein the continuous transmission line has a specific overall electrical length;
   wherein said microstrip assembly is aligned in the superior/inferior (S/I) direction, with the hybrid microstrip coil oriented along a static magnetic field B0.

2. The hybrid microstrip coil according to claim 1, wherein the hybrid microstrip coil is a microstrip receiver coil and comprises at least one additional interleaved microstrip assembly.

3. The hybrid microstrip coil according to claim 1, wherein said coaxial sections have a characteristic impedance that is substantially equivalent to the microstrip assembly.

4. The hybrid microstrip coil according to claim 1, wherein an outer conductor of said coaxial section is electrically connected to the shield plane and a center conductor of said coaxial section is electrically connected to the conductive strips.

5. The hybrid microstrip coil according to claim 4, wherein said center conductor is electrically connected to the conductive strips through at least one of via, trace, or wire through hole in the substrate.

6. The hybrid microstrip coil according to claim 1, where the specific overall electrical length is λ/2 or an integer multiple of λ/2 at the Larmor frequency.

7. The hybrid microstrip coil according to claim 1, where the overall electrical length is λ/4 or an odd integer multiple of λ/4 at the Larmor frequency.

8. The hybrid microstrip coil according to claim 1, wherein a width of the shield plane is wider than a width of the conducting strip.

9. The hybrid microstrip coil according to claim 1, wherein the microstrip assembly is comprised of linear segments and the coil has a length of less than 30 cm.

10. The hybrid microstrip coil according to claim 1, wherein the coaxial sections are shielded to minimize noise such that only the microstrips contribute to an image.

11. The hybrid microstrip coil according to claim 1, wherein said magnetic resonance imaging provides for at least one of parallel imaging and parallel transmit.

12. The hybrid microstrip coil according to claim 1, further comprising lumped elements coupled to the microstrip assembly for impedance matching and tuning.

13. The hybrid microstrip coil according to claim 1, further comprising connectors that are electrically coupled to at said least one microstrip assembly.

14. The hybrid microstrip coil according to claim 13, further comprising matching circuits electrically coupled to the connectors that transform the hybrid microstrip coil impedance to 50 ohms.

15. An array structure for magnetic resonance imaging, comprising:
   two or more hybrid microstrip receiver coils forming said array, each of said receiver coils comprising microstrip assemblies having a plurality of conductive strips on a first side of a substrate and corresponding shield sections opposing the conductive strips on an opposite side of said substrate;
   coaxial cables on at least one side of the substrate electrically coupling the microstrip assemblies forming a continuous transmission line with a specified overall electrical length, wherein center conductors of the coaxial cables electrically couple adjacent conductive strips and corresponding outer conductors of the coaxial cables are electrically coupled to adjacent shield sections, and wherein said microstrip assemblies are aligned in the superior/inferior (S/I) direction and the hybrid microstrip receiver coils are oriented along a static magnetic field B0.

16. The array according to claim 15, wherein the microstrip receiver coils are interleaved on the substrate.

17. The array according to claim 15, wherein the microstrip assemblies are comprised of linear segments of conductive strips and shield sections and array has a length of less than 30 cm.

18. The array according to claim 15, wherein the coaxial cables are disposed on the opposite side of the substrate, said outer conductors of said coaxial cable are electrically connected to the shield sections and said center conductors of said coaxial cables are electrically connected to the conductive strips through vias.

19. The array according to claim 15, wherein the coaxial cables form said continuous transmission line by coupling adjacent microstrip assemblies at alternating ends.

* * * * *